(12) United States Patent
Staszewski et al.

(10) Patent No.: US 6,326,851 B1
(45) Date of Patent: Dec. 4, 2001

(54) DIGITAL PHASE-DOMAIN PLL FREQUENCY SYNTHESIZER

(75) Inventors: Robert B. Staszewski, Garland; Dirk Leipold, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/603,023

(22) Filed: Jun. 26, 2000

(51) Int. Cl.$^7$ ................................... H03L 7/085
(52) U.S. Cl. ................... 331/17; 331/18; 331/25; 331/1 A; 327/156; 327/159
(58) Field of Search .................. 331/18, 17, 25, 331/27, 1 A; 327/156, 159

(56) References Cited
U.S. PATENT DOCUMENTS

| | | | |
|---|---|---|---|
| 5,495,205 | * | 2/1996 | Parker et al. ................ 331/1 A |
| 5,546,433 | * | 8/1996 | Tran et al. ................... 331/17 |
| 5,856,761 | * | 1/1999 | Jokura ........................ 331/11 |
| 5,910,753 | * | 6/1999 | Bogdan ....................... 331/17 |

* cited by examiner

Primary Examiner—Siegfried H. Grimm
(74) Attorney, Agent, or Firm—Dwight N. Holmbo; Wade James Brady, III; Frederick J. Telecky, Jr.

(57) ABSTRACT

A frequency synthesizer architecture naturally combines transmitter modulation capability with a wideband all-digital PLL modulation scheme to maximize a digitally-intensive implementation by operating in a synchronous phase-domain. Synchronous logic is provided across a digitally controlled VCO and is synchronous to the VCO output clock by implementing a timing adjustment in association with a reference calculation to allow a frequency control word to contain both channel information and transmit modulation information.

48 Claims, 2 Drawing Sheets

DIGITAL PHASE-DOMAIN PLL FREQUENCY SYNTHESIZER

BACKGROUND OF THE INVENTION

1. Field of the Invention

This invention relates generally to frequency synthesizers, and more particularly to an all-digital phase-domain phase-lock loop (PLL) frequency synthesizer that operates in a synchronous phase-domain to maximize a digitally-intensive architecture.

2. Description of the Prior Art

Frequency synthesizers using analog circuit techniques are well known in the art. Conventional RF frequency synthesizer architectures are analog-intensive and generally require a low loop bandwidth to reduce the familiar and well-known reference or compare frequency spurs. Low loop bandwidths are acceptable for RF-BiCMOS and RF-SiGe processes with weak digital capabilities.

Modern deep sub-micron CMOS processes and their RF-CMOS derivatives, however, are not very compatible with frequency synthesizer designs using analog circuit techniques. The conventional PLL-based frequency synthesizers generally comprise analog-intensive circuitry that does not work very well in a voltage-headroom-constrained aggressive CMOS environment. Such frequency synthesizers do not take advantage of recently developed high density digital gate technology.

Newer frequency synthesizer architectures have used sigma-delta modulated frequency divider techniques to randomize the above discussed frequency spurs by randomizing the spurious content at the cost of increased noise floor. These techniques have not significantly reduced the undesirable analog content. Other frequency synthesizer architectures have used direct digital synthesis (DDS) techniques that do not work at RF frequencies without a frequency conversion mechanism requiring an analog solution. Further, previous all-digital PLL architectures rely on an over-sampling clock. Such architectures cannot be used at RF frequencies.

In view of the foregoing, it is highly desirable to have a digitally-intensive frequency synthesizer architecture that is compatible with modern CMOS technology.

SUMMARY OF THE INVENTION

The present invention is directed to an all-digital phase-domain PLL frequency synthesizer that is compatible with deep sub-micron CMOS processes. The all-digital phase-domain PLL frequency synthesizer accommodates direct frequency/phase modulation transmission to remove the requirement for an additional transmitting modulator normally associated with wireless digital transmitters. This is accomplished by operating the PLL entirely in the phase-domain with maximum digital processing content such that the loop can be of high-bandwidth of "type 1" without the need for a loop filter. A "type 1" filter, as used herein, means a loop filter having only one integrating pole in the feedback loop. Only one integrating pole exists due to the VCO frequency-to-phase conversion. It is possible therefore, to eliminate a low-pass filter between the phase detector and the oscillator tuning input, resulting in a high bandwidth and fast response of the PLL loop.

According to one embodiment, the all-digital phase-domain PLL frequency synthesizer contains only one major analog component, a digitally-controlled 2.4 GHz voltage controlled oscillator (VCO or dVCO). The PLL loop is an all-digital phase-domain architecture whose purpose is to generate the 2.4 GHz high frequency $f_{osc}$ for the "BLUETOOTH" standard. The underlying frequency stability of the system is derived from a reference crystal oscillator, such as a 13 MHz TCXO for the global system for mobile communications (GSM) system. The phase of the VCO output is obtained by accumulating the number of significant (rising or falling) edge clock transitions. The phase of the reference oscillator is obtained by accumulating a frequency control word on every significant (rising or falling) edge of the reference oscillator output that is re-clocked via the VCO output. As used herein, "significant edge" means either a "rising" or a "falling" edge. A ceiling element continuously adjusts a reference phase value associated with the accumulated frequency control word by rounding off to the next integer (alternatively, truncating fractional bits necessary) to compensate for fractional-period delays caused by re-clocking of the reference oscillator by the VCO output. The phase error signal is then easily obtained by using a simple arithmetic subtraction of the VCO phase from the adjusted reference phase on every significant edge of the re-clocked reference oscillator output. The phase error signal can then be used as the tuning input to the digitally-controlled VCO directly via a gain element associated with the PLL loop operation.

In one aspect of the invention, an all-digital phase-domain PLL frequency synthesizer is provided that allows fast design turn-around using automated CAD tools.

In still another aspect of the invention, an all-digital phase-domain PLL frequency synthesizer is provided that achieves much less undesirable parameter variability than normally associated with analog circuits.

In yet another aspect of the invention, an all-digital phase-domain PLL frequency synthesizer is provided that allows ease of testability.

In yet another aspect of the invention, an all-digital phase-domain PLL frequency synthesizer is provided that requires desirably low silicon area to physically implement.

In yet another aspect of the invention, an all-digital phase-domain PLL frequency synthesizer is provided that requires lower power than conventional frequency synthesizers.

In still another aspect of the invention, an all-digital phase-domain PLL frequency synthesizer is provided that has direct frequency/phase modulation transmission capability to minimize system transmitter requirements.

In still another aspect of the invention, an all-digital phase-domain PLL frequency synthesizer is provided that accommodates the "BLUETOOTH" communication protocol.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
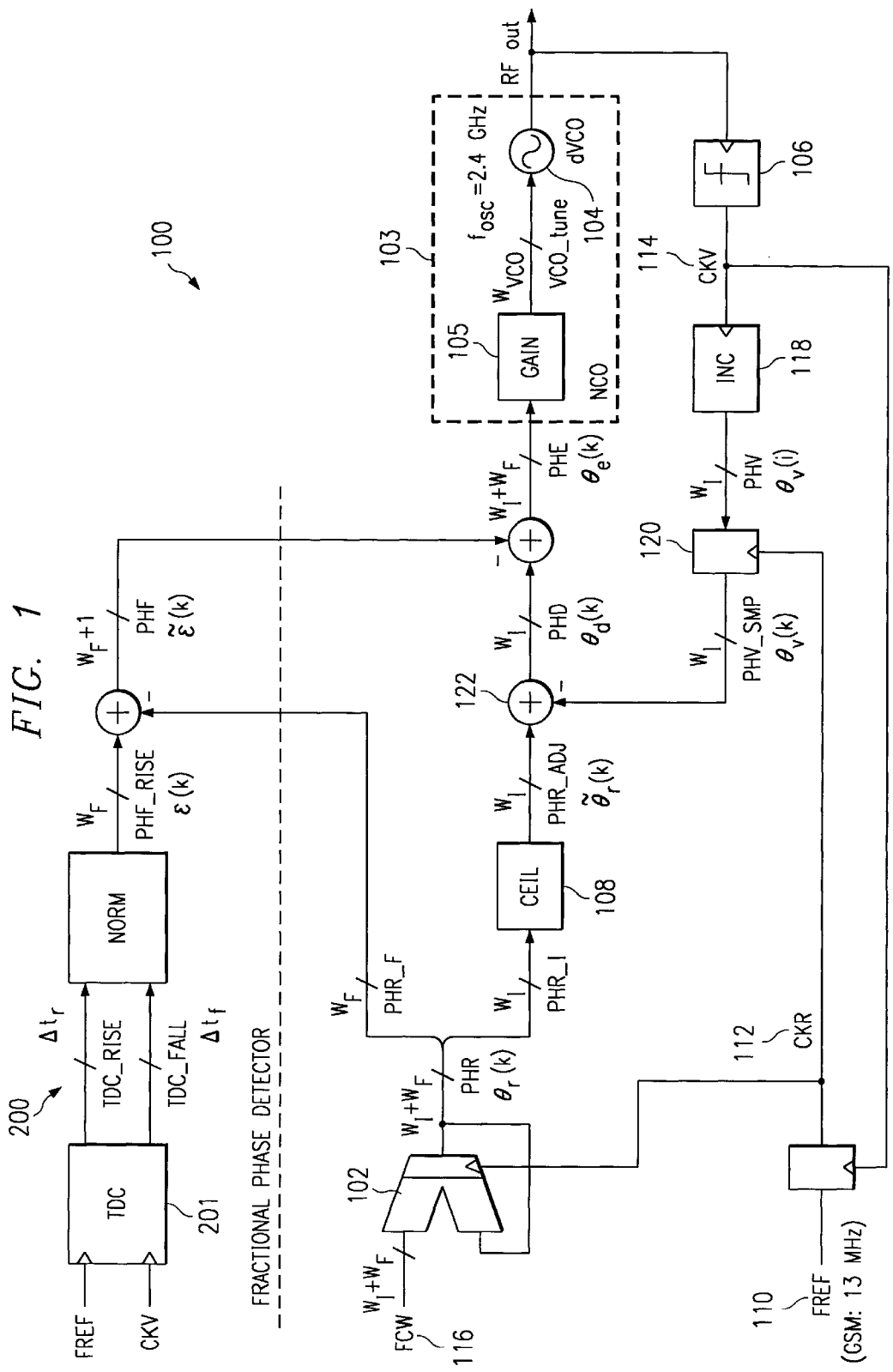
FIG. 1 illustrates an all-digital PLL synthesizer architecture according to one embodiment of the present invention.

FIG. 1 illustrates an all-digital PLL synthesizer 100 architecture according to one embodiment of the present invention. The synthesizer 100 naturally combines transmitter frequency modulation capability with a wideband, all-digital PLL modulation technique to maximize digitally-intensive implementation by operating in a synchronous phase-domain. The PLL loop is an all-digital phase-domain architecture capable of generating the 2.4 GHz high frequency $f_{osc}$ for the "BLUETOOTH" standard band. Accordingly, the all-digital phase-domain PLL frequency synthesizer 100 depicted in FIG. 1 contains only one major analog/RF component, a digitally-controlled 2.4 GHz voltage controlled oscillator (dVCO) 104, being a portion of a numerically-controlled oscillator (NCO) 103, that also comprises a gain element 105. The underlying frequency stability of the synthesizer 100 is derived from a frequency reference crystal oscillator 110, such as a 13 MHz TCXO for the GSM system.

The phase $\theta_v(iT_v)$ of the dVCO 104 clock signal, CKV 114, with period $T_v$, at time instances $iT_v$, where i is an integer, is obtained by accumulating the number of rising- or falling-edge clock transitions generated via a sinusoidal-to-digital converter 106.

$$\theta_v(iT_v) = \sum_{t=0}^{iT_v} f_v(t) \quad (\times 2\pi \cdot \text{rad}) \tag{1}$$

Without use of frequency reference retiming (described herein below), the phase $\theta_r(kT_r)$ of a frequency reference clock, FREF, provided by the reference crystal oscillator (FREF) 110, with period $T_r$, at time instances $kT_r$ where k is another integer, is obtained by accumulating 102 the frequency control word (FCW 116) on every rising (or falling) edge of the frequency reference clock FREF.

$$\theta_r(kT_r) = FCW \cdot k \cdot T_r (\times 2\pi \cdot \text{rad}) \tag{2}$$

The PLL operation achieves, in a steady-state condition, a zero averaged phase difference between the dVCO 104 $\theta_v(iT_v)$ and the reference crystal oscillator 110 $\theta_r(kT_r)$ phases. Equation (3) below shows the clock period relationship in the mean sense.

$$FCW = N_i = N_f = T_r/T_v. \tag{3}$$

The present invention is not so limited however, and it shall be readily understood that FCW 116 can be comprised of only an integer or an integer ($N_i$) and fractional ($N_f$) parts.

As stated herein before, there is no need for a frequency detection function within the phase detector when operating the PLL loop in the phase-domain. This feature importantly allows "type 1" operation of the PLL, where it is possible to eliminate a low-pass filter between the phase detector and the oscillator (dVCO 104), resulting in a high-bandwidth and fast response of the PLL loop.

The dVCO 104 and the reference crystal oscillator 110 clock domains are entirely asynchronous, making it difficult to physically compare the two digital phase values $\theta_v(iT_v)$ and $\theta_r(kT_r)$ at different time instances $iT_v$ and $kT_r$. Mathematically, $\theta_v(iT_v)$ and $\theta_r(kT_r)$ are discrete-time signals with incompatible sampling times and cannot be directly compared without some sort of interpolation. The present inventors recognized therefore, it is imperative that any digital-word comparison be performed in the same clock domain. This function is achieved by over-sampling the FREF reference oscillator 110 by the high-rate dVCO 104 output CKV 114, and using the resulting frequency reference clock CKR 112 to accumulate via accumulator 102 the reference phase $\theta_r(kT_r)$ as well as to synchronously sample, via latch/register 120, the high-rate dVCO 104 phase $\theta_v(iT_v)$. Since the foregoing phase comparison is performed synchronously at the rising edge of CKR 112, equations (1) and (2) can now be rewritten as follows:

$$\theta_v(k) = \sum_{t=0}^{k \cdot T_r} f_v(t) \quad (\times 2\pi \cdot \text{rad}) \tag{4}$$

$$\theta_r(k) = FCW \cdot k \cdot T_r + \epsilon(k)(\times 2\pi \cdot \text{rad}) \tag{5}$$

where the index k is the kth transition of the re-timed reference clock CKR 112 and contains an integer number of CKV 114 clock transitions; and $\epsilon(k)$ is the integer-loop quantization error, in the range of $\epsilon \in (0,1)$, that could be further corrected by other means, such as a fractional phase detector 200 discussed in more detail herein below with reference to FIGS. 2–4.

In view of the above, the integer phase detector in the synchronous digital phase environment can now be realized as a simple arithmetic subtraction via combinatorial element 122 of the dVCO 104 phase from the reference phase performed every rising edge of the CKR clock 112.

$$\theta_d(k) = \theta_r(k) - \theta_v(k) \tag{6}$$

The reference re-timing operation can be recognized as a quantization in the dVCO 104 CKV 114 clock transitions integer domain, where each CKV 114 clock transition rising edge is the next integer. Since the synthesizer 100 must be time-causal, quantization to the next CKV 114 clock transition rising edge (next integer), rather than the closest transition (rounding-off to the closest integer), can only be realistically performed. This limitation is then compensated for in the phase-domain by the ceiling element 108 associated with the reference phase since the reference phase $\theta_r(k)$ is generally a fixed-point arithmetic signal having a sufficiently large fractional part to achieve the required frequency resolution as set forth in Equation 3 above. As stated herein before, a ceiling element 108 continuously adjusts a reference phase value associated with the accumulated frequency control word by rounding to the next integer (alternatively, truncating the fractional bits), thereby compensating for delays caused by re-clocking of the reference oscillator 110 by the VCO output CKV 114. The ceiling operation (demonstrated via Equation 7) could be easily implemented by discarding the fractional bits and incrementing the integer bits. This technique, however, improperly handles the case when the fractional part is zero, but has no practical consequences. Those skilled in the art will appreciate that this truncation process achieves a timing correction since phase is a characteristic that can be used to describe a time progression. The phase resolution, however, cannot be better than $+/-\pi$ radians of the dVCO 104 clock, even though the foregoing integer-loop quantization error $\epsilon$ due to reference phase retiming illustrated by Equation 5 is compensated by next-integer rounding operation (ceiling) of the reference phase.

$$\theta_r(k) = \lceil \theta_r(k) \rceil \qquad (7)$$

Figure 2:
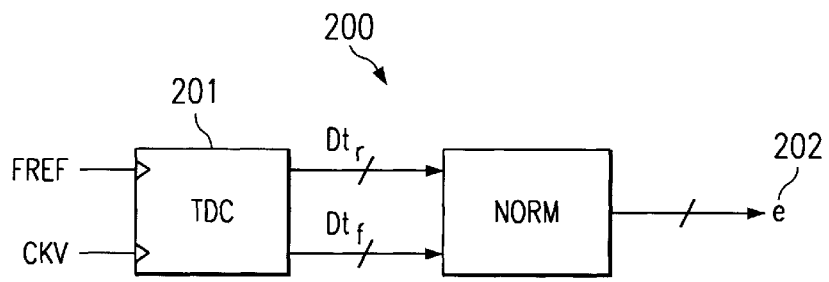
FIG. 2 is a simple block diagram illustrating a quantization scheme for fractional-phase detection associated with the synthesizer depicted in FIG. 1.

FIG. 2 is a simple block diagram illustrating a digital fractional phase detector system 200 capable of accommodating a quantization scheme to measure fractional (sub-Tv) delay differences between the significant edge of the dVCO 104 clock CKV 114 and the FREF oscillator 110 reference clock 112 using a time-to-digital converter (TDC) 201 with a resolution of $\Delta t_{ref}$ and express the time difference as a digital word for the synthesizer 100 shown in FIG. 1 according to one embodiment of the present invention. Due to the dVCO 104 edge counting nature of the PLL, it can be appreciated that the phase quantization resolution cannot be better than $+/-\pi$ radians as stated above. A much finer phase resolution however, is required for wireless applications. Such finer resolution must be achieved without forsaking the requisite digital signal processing capabilities. The solution illustrated in FIG. 2 measures the one-sided fractional (sub-$T_v$) delay difference between the dVCO 104 clock CKV 114 and the FREF oscillator 110 clock 112 to express the time difference as a digital word $\epsilon$ 202. According to one embodiment, the maximum achievable timing resolution of the digital fractional phase detector 200 is determined by an inverter delay associated with a given CMOS process, and is about 40 psec for the C035.1 CMOS process developed by Texas Instruments Incorporated of Dallas, Tex. The digital fractional phase is determined by passing the dVCO 104 clock CKV 114 through a chain of inverters (not shown), such that each inverter output would produce a clock pulse slightly delayed from that of the immediately previous inverter. The resultant staggered clock phases would then be sampled by the same reference clock.

Figure 3:
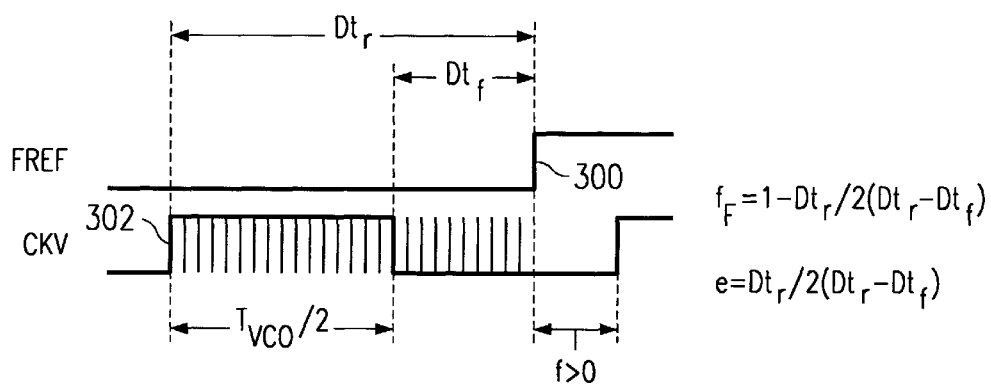
FIG. 3 is a timing diagram illustrating a frequency reference clock signal and a VCO signal for a positive fractional-phase.
Figure 4:
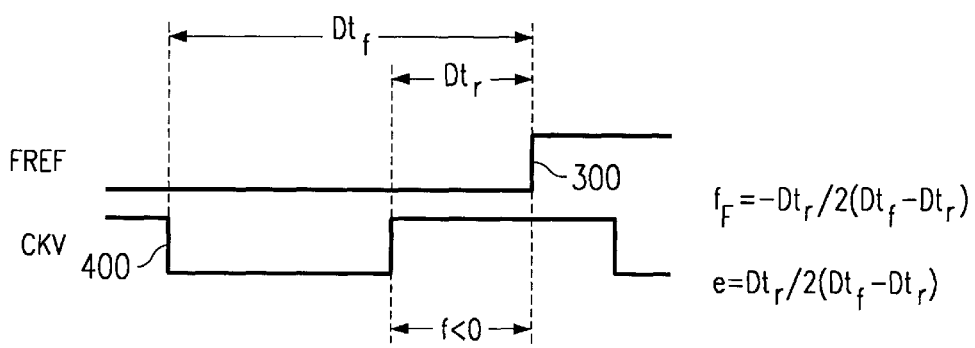
FIG. 4 is a timing diagram illustrating a frequency reference clock signal and a VCO signal for a negative fractional-phase.

As seen in FIGS. 3 and 4, position of the detected transition from 0 to 1 would indicate a quantized time delay $\Delta T_r$ between the FREF 110 sampling edge and the rising edge 302 of the dVCO clock, CKV 114 in $\Delta t_{res}$ multiples; and position of the detected transition from 1 to 0 would indicate a quantized time delay $\Delta T_f$ between the FREF 110 sampling edge and the falling edge 400 of the dVCO clock, CKV 114. Because of the time-causal nature of the foregoing digital fractional phase detection process, both time delay values $\Delta T_r$ and $\Delta T_f$ must be interpreted as positive. This is fine if $\Delta T_r$ is smaller than $\Delta T_f$ since this situation corresponds to the negative phase error of the classical PLL loop in which the VCO edge is ahead of the reference edge and, therefore, the phase sign has to be negated. If $\Delta T_r$ is greater than $\Delta T_f$ however, the situation becomes problematic since the situation now corresponds to the positive phase error of the classical PLL loop. The time lag between the reference edge FREF 110 and the following rising edge of CKV 114 must be based on the available information regarding the delay between the preceding rising edge of CKV 114 and the reference edge FREF 110 as well as the clock half-period which can be expressed as a difference as shown by Equation 8 below.

$$T_v/2 = \begin{cases} \Delta t_r - \Delta t_r & \Delta t_r \geq \Delta t_f \\ \Delta t_f - \Delta t_r & \text{otherwise} \end{cases} \qquad (8)$$

The foregoing analysis is summarized in Equation 9 below, where $\Delta t_{frac}$ is the digital fractional phase detector error.

$$\Delta t_{frac} = \begin{cases} -\Delta t_r & \Delta t \leq \Delta t_f \\ \Delta t_r - 2 \cdot \Delta t_f & \text{otherwise} \end{cases} \qquad (9)$$

The period-normalized fractional phase is then described by Equation 10 as:

$$\phi_F = \Delta t_{frac}/T_v \qquad (10)$$

In the present implementation, the fractional phase $\phi_F$ is not needed. Instead, $\Delta t_r$ is used to calculate the $\epsilon(k)$ correction of Equation 5 that is positive and $\epsilon \in (0,1)$. $\Delta t_r$ has to be normalized by dividing it by the clock period, in order to properly combine it with the integer phase detector output, $\theta_d$.

$$\epsilon(k) = \Delta t_r(k)/T_v(k) = \begin{cases} \Delta t_r/2(\Delta t_f - \Delta t_r) & \Delta t_r \leq \Delta t_f \\ \Delta t_r/2(\Delta t_r - \Delta t_f) & \text{otherwise} \end{cases} \qquad (11)$$

When the dVCO 104 clock period $T_v$ is an integer division of the frequency reference clock period $T_r$, the $\epsilon(k)$ samples are seen to be constant. The $\epsilon(k)$ samples increase linearly within the modulo (0,1) range where this ratio is fractional. In view of the foregoing, a simple pattern can therefore be easily predicted in digital form that closely corresponds mathematically to the well-known analog fractional phase compensation scheme of fractional-N PLL frequency synthesizers.

$$\epsilon(k) = \epsilon(k) - \text{fract}(\theta_r(k)) \qquad (12)$$

The composite phase error $\theta_e(k)$ is obtained through correcting the integer-valued $\theta_d(k)$ by fractional-division-ratio-corrected $\epsilon(k)$ as shown in Equation 13.

$$\theta_e(k) = \theta_d(k) - \epsilon(k) \qquad (13)$$

The fractional phase detector output $\epsilon(k)$ or $\phi_F(k)$ sequence can be easily compared on a bit-by-bit basis; and since the expected output pattern is known in advance and is now in the digital format, a better alternative of a Viterbi sequence detection or a matched filter could be used. In such a scenario, the space difference between the observed and expected patterns could be output as the fractional phase error. This solution provides a system with less reference feed through and lower overall error.

The present PLL loop operation can be further enhanced by taking advantage of the predictive capabilities of the all-digital PLL loop. The dVCO 104, for example, does not necessarily have to follow the modulation FCW 116 command with the normal PLL loop response. In one embodiment, where the dVCO 104 control and the resulting phase error measurement are in numerical format, it is easy to predict the current $K_{vco}$ gain of the dVCO 104 by simply observing the past phase error responses to the NCO corrections. With a good estimate of the $K_{vco}$ gain, the normal NCO control could be augmented with the "open loop" instantaneous frequency jump estimate of the new FCW 116 command. It can be appreciated that the resulting phase error should be very small and subject to the normal closed PLL loop correction transients.

Since the time response of this "type 1" PLL is very fast (less than 1 µsec), the prediction feature is less important for channel hopping, where the allowed time is much greater. The foregoing prediction feature is, however, essential to realize the direct frequency synthesizer modulation in the *Gaussian frequency shift keying* GFSK modulation scheme of "BLUETOOTH" or GSM.

In view of the above, it can be seen the present invention presents a significant advancement in the art of RF synthesizer circuits and associated methods. This invention has been described in considerable detail in order to provide those skilled in the RF synthesizer art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. A digital phase-domain phase-locked loop (PLL) frequency synthesizer comprising:
   a digitally-controlled voltage controlled oscillator (dVCO) having an input and an output;
   a frequency reference oscillator coupled to the dVCO output such that a reclocked frequency reference signal is generated in response to an output signal generated at the output of the dVCO; and
   a synchronous control logic all-digital PLL connected between the input and output of the dVCO and responsive to the reclocked frequency reference signal, such that the PLL is synchronous to the dVCO output signal.

2. The digital phase-domain phase-locked loop (PLL) frequency synthesizer according to claim 1 wherein the synchronous control logic all-digital PLL comprises an accumulator having a first input configured to receive a digital input frequency control word and a second input configured to receive the reclocked frequency reference signal, the accumulator configured to accumulate the digital input frequency control word on every significant edge of the reclocked frequency reference signal to generate a digital reference phase signal.

3. The digital phase-domain phase-locked loop (PLL) frequency synthesizer according to claim 2 wherein the synchronous control logic all-digital PLL further comprises a ceiling element having an input configured to receive the digital reference phase signal such that the ceiling element can truncate fractional bits of the digital reference phase signal to generate an adjusted digital reference phase signal.

4. The digital phase-domain phase-locked loop (PLL) frequency synthesizer according to claim 2 wherein the synchronous control logic all-digital PLL further comprises a ceiling element having an input configured to receive the digital reference phase signal such that the ceiling element can round off the digital reference phase signal to the next integer to generate an adjusted digital reference phase signal.

5. The digital phase-domain phase-locked loop (PLL) frequency synthesizer according to claim 3, wherein the synchronous control logic all-digital PLL further comprises a combinatorial element having a first input configured to receive the adjusted digital reference phase signal and a second input configured to receive a dVCO digital output phase signal, wherein the combinatorial element is configured to generate a difference between the dVCO digital output phase signal and the adjusted digital reference phase signal to generate a new digital control word.

6. The digital phase-domain phase-locked loop (PLL) frequency synthesizer according to claim 5 wherein the synchronous control logic all-digital PLL further comprises an analog-to-digital signal converter configured to transform an analog signal generated by the dVCO to a dVCO digital output clock.

7. The digital phase-domain phase-locked loop (PLL) frequency synthesizer according to claim 6 wherein the synchronous control logic all-digital PLL further comprises an incrementor element configured to count dVCO digital output clock significant edge transitions to provide a dVCO output phase signal.

8. The digital phase-domain phase-locked loop (PLL) frequency synthesizer according to claim 7 wherein the synchronous control logic all-digital PLL further comprises a latch/register having an input configured to receive the dVCO digital phase signal and clocked by the reclocked reference signal to generate a sampled dVCO output phase signal.

9. The digital phase-domain phase-locked loop (PLL) frequency synthesizer according to claim 8 wherein the synchronous control logic all-digital PLL further comprises a gain element having an input configured to receive the new digital control word and generate a dVCO tuning control word therefrom.

10. The digital phase-domain phase-locked loop (PLL) frequency synthesizer according to claim 5 wherein the synchronous control logic all-digital PLL is configured to transform an analog signal generated by the dVCO to a dVCO digital output clock.

11. The digital phase-domain phase-locked loop (PLL) frequency synthesizer according to claim 10 wherein the synchronous control logic all-digital PLL further comprises an incrementor element configured to count dVCO digital output significant edge clock transitions to provide a dVCO output phase signal.

12. The digital phase-domain phase-locked loop (PLL) frequency synthesizer according to claim 11 wherein the synchronous control logic all-digital PLL further comprises a latch/register having an input configured to receive the dVCO digital phase signal and clocked by the reclocked reference signal to generate a sampled dVCO output phase signal.

13. The digital phase-domain phase-locked loop (PLL) frequency synthesizer according to claim 12 wherein the synchronous control logic all-digital PLL further comprises a gain element having an input configured to receive the new digital control word and generate a dVCO tuning control word therefrom.

14. The digital phase-domain phase-locked loop (PLL) frequency synthesizer according to claim 4, wherein the synchronous control logic all-digital PLL further comprises a combinatorial element having a first input configured to receive the adjusted digital reference phase signal and a second input configured to receive a dVCO digital output phase signal, wherein the combinatorial element is configured to generate a difference between the dVCO digital output phase signal and the adjusted digital reference phase signal to generate a new digital control word.

15. The digital phase-domain phase-locked loop (PLL) frequency synthesizer according to claim 14 wherein the synchronous control logic all-digital PLL further comprises an analog-to-digital signal converter configured to transform an analog signal generated by the dVCO to a dVCO digital output clock.

16. The digital phase-domain phase-locked loop (PLL) frequency synthesizer according to claim 15 wherein the synchronous control logic all-digital PLL further comprises an incrementor element configured to count dVCO digital output clock significant edge transitions to provide a dVCO output phase signal.

17. The digital phase-domain phase-locked loop (PLL) frequency synthesizer according to claim 16 wherein the synchronous control logic all-digital PLL further comprises a latch/register having an input configured to receive the dVCO digital phase signal and clocked by the reclocked reference signal to generate a sampled dVCO output phase signal.

18. The digital phase-domain phase-locked loop (PLL) frequency synthesizer according to claim 17 wherein the synchronous control logic all-digital PLL further comprises a gain element having an input configured to receive the new digital control word and generate a dVCO tuning control word therefrom.

19. The digital phase-domain phase-locked loop (PLL) frequency synthesizer according to claim 14 wherein the synchronous control logic all-digital PLL is configured to transform an analog signal generated by the dVCO to a dVCO digital output clock.

20. The digital phase-domain phase-locked loop (PLL) frequency synthesizer according to claim 19 wherein the synchronous control logic all-digital PLL further comprises an incrementor element configured to count dVCO digital output significant edge clock transitions to provide a dVCO output phase signal.

21. The digital phase-domain phase-locked loop (PLL) frequency synthesizer according to claim 20 wherein the synchronous control logic all-digital PLL further comprises a latch/register having an input configured to receive the dVCO digital phase signal and clocked by the reclocked reference signal to generate a sampled dVCO output phase signal.

22. The digital phase-domain phase-locked loop (PLL) frequency synthesizer according to claim 21 wherein the synchronous control logic all-digital PLL further comprises a gain element having an input configured to receive the new digital control word and generate a dVCO tuning control word therefrom.

23. A synchronous logic all-digital phase-locked loop (PLL) for a frequency synthesizer comprising:
a frequency reference clock configured to receive a digital VCO output signal such that a reclocked frequency reference signal can be generated in response to the digital VCO output signal; and
a synchronous control logic configured to receive the digital VCO output signal and responsive to the reclocked frequency reference signal, such that the control logic can formulate a PLL that is synchronous to the digital VCO output signal.

24. The synchronous logic all-digital phase-locked loop (PLL) for a frequency synthesizer according to claim 23 wherein the synchronous control logic comprises a digital frequency control word accumulator configured to accumulate a digital frequency control word during a transition of the reclocked frequency reference signal.

25. The synchronous logic all-digital phase-locked loop (PLL) for a frequency synthesizer according to claim 24 wherein the synchronous control logic further comprises a ceiling element configured to receive and truncate fractional bits of the accumulated digital frequency control word to generate an adjusted digital reference phase control word.

26. The synchronous logic all-digital phase-locked loop (PLL) for a frequency synthesizer according to claim 25 wherein the synchronous control logic further comprises means for receiving a digital VCO output phase signal and the adjusted digital reference phase control word and generating a phase error control word therefrom.

27. The synchronous logic all-digital phase-locked loop (PLL) for a frequency synthesizer according to claim 26 further comprising means for receiving the phase error control word and generating a digital VCO tuning control word therefrom such that the digital VCO tuning control word is synchronous to the digital VCO output signal.

28. The synchronous logic all-digital phase-locked loop (PLL) for a frequency synthesizer according to claim 24 wherein the synchronous control logic further comprises a ceiling element configured to receive and round off to the next integer the accumulated digital frequency control word to generate an adjusted digital reference phase control word.

29. The synchronous logic all-digital phase-locked loop (PLL) for a frequency synthesizer according to claim 28 wherein the synchronous control logic further comprises means for receiving a digital VCO output phase signal and the adjusted digital reference phase control word and generating a digital phase error control word therefrom.

30. The synchronous logic all-digital phase-locked loop (PLL) for a frequency synthesizer according to claim 29 further comprising means for receiving the digital phase error control word and generating a digital VCO tuning control word therefrom such that the digital VCO tuning control word is synchronous to the digital VCO output signal.

31. A method of synchronizing an all-digital phase-locked loop (PLL) to an output wave of a frequency synthesizer having a digitally-controlled VCO comprising the steps of:
a) generating a digital VCO output signal;
b) converting the digital VCO output signal to a first digital clock;
c) generating a frequency reference clock and reclocking the frequency reference clock via the first digital clock;
d) accumulating a digital frequency control word in synchronization with the reclocked frequency reference clock;
e) adjusting the accumulated digital frequency control word to compensate for fractional-period timing differences between the reference clock and the first digital clock;
f) accumulating a plurality of first digital clock transitions to determine a phase associated with the digital VCO output signal; and
g) combining the accumulated plurality of first digital clock transitions and the adjusted accumulated digital frequency control word to generate a phase error control word, wherein the phase error control word is a difference between the accumulated plurality of first digital clock transitions and the adjusted accumulated digital frequency control word.

32. The method according to claim 31 further comprising the step of:
h) multiplying the phase error control word to generate a digital VCO tuning control word therefrom.

33. The method according to claim 32 further comprising the step of:

h) estimating a sequence based on newly generated digital phase error control words and generating a digital VCO tuning control word therefrom.

34. A digital phase-domain phase-locked loop (PLL) frequency synthesizer comprising:

a digitally-controlled voltage controlled oscillator (dVCO) having an input and an output;

a frequency reference oscillator configured to receive a digital signal associated with the dVCO output such that a reclocked reference signal is generated in response to a signal generated at the output of the dVCO;

a digital frequency control word accumulator configured to accumulate a digital frequency control word in synchronization with the reclocked reference signal and generate a digital reference phase control word therefrom;

a digital ceiling element configured to modify the digital reference phase control word and generate an adjusted digital reference phase control word therefrom;

a dVCO output phase accumulation system configured to accumulate significant edge clock transitions associated with the dVCO output signal; and a combinatorial element configured to combine the accumulated digital dVCO output signal and the adjusted digital reference phase control word to generate a phase error control word therefrom, wherein the phase error control word is a difference between the accumulated digital dVCO output signal and the adjusted digital reference phase control word.

35. The digital phase-domain phase-locked loop (PLL) frequency synthesizer according to claim 34 further comprising a gain element configured to receive the phase error control word and generate a dVCO tuning control word therefrom such that the dVCO control word is synchronous to the dVCO output signal.

36. The digital phase-domain phase-locked loop (PLL) frequency synthesizer according to claim 34 wherein the ceiling element is configured to modify the digital reference phase control word by truncating fractional bits of the digital reference phase control word.

37. The digital phase-domain phase-locked loop (PLL) frequency synthesizer according to claim 34 wherein the ceiling element is configured to modify the digital reference phase control word by rounding off to the next integer the digital reference phase control word.

38. A method synchronizing VCO clock to a frequency reference clock, the method comprising the steps of:

a) providing a frequency reference clock (FREF);

b) providing an oscillator that is responsive to a tuning input signal formulated in part from a digitized output signal (CKV) associated with the oscillator to implement a tuning operation capable of controlling a frequency/phase characteristic associated with the oscillator;

c) providing a digital frequency control word (FCW) capable of establishing a desired frequency ratio between the oscillator and the frequency reference clock;

d) providing a digital phase control system responsive to the digital frequency control word (FCW) and the digitized output signal (CKV), and that when combined with the oscillator tuning operation, forms a phase-locked loop; and e) retiming the frequency reference clock via the digitized oscillator output signal (CKV) to formulate a digital phase control system clock (CKR) such that the digital phase control system can generate the tuning input signal.

39. The method according to claim 38 further comprising the step of:

f) accumulating the digital frequency control word (FCW) to generate a digital reference phase control signal (PHR) during each significant edge of the digital phase control system clock (CKR).

40. The method according to claim 39 further comprising the step of:

g) rounding off to the next integer the digital reference phase control signal (PHR) to generate an adjusted digital reference phase control word (PHR_ADJ).

41. The method according to claim 40 further comprising the step of:

h) counting significant edges of the digitized output signal (CKV) to generate a VCO phase signal (PHV).

42. The method according to claim 41 further comprising the step of:

i) sampling the VCO phase signal (PHV) to generate a sampled VCO phase signal (PHV_SMP).

43. The method according to claim 42 further comprising the step of:

j) combining the adjusted digital reference phase control word (PHR_ADJ) and the sampled VCO phase signal (PHV_SMP) to generate the tuning input signal.

44. The method according to claim 42 further comprising the step of:

j) generating a digital fractional phase control word (PHF).

45. The method according to claim 44 further comprising the step of:

k) combining the adjusted digital reference phase control word (PHR_ADJ), the sampled VCO phase signal (PHV_SMP), and optionally, further combining the digital fractional phase control word (PHF) to generate the tuning input signal.

46. The method according to claim 41 further comprising the step of:

i) combining the adjusted digital reference phase control word (PHR_ADJ) and the VCO phase signal (PHV) to generate the tuning input signal.

47. The method according to claim 46 further comprising the step of:

j) generating a digital fractional phase control word (PHF).

48. The method according to claim 47 further comprising the step of:

k) combining the adjusted digital reference phase control word (PHR_ADJ), the VCO phase signal (PHV), and optionally, further combining the digital fractional phase control word (PHF) to generate the tuning input signal.

* * * * *